United States Patent [19]
Bellantoni

[11] Patent Number: 5,745,328
[45] Date of Patent: Apr. 28, 1998

[54] ELECTROMAGNETIC IMPULSE SUPPRESSION CURCUIT

[75] Inventor: John V. Bellantoni, Redwood City, Calif.

[73] Assignee: Watkins-Johnson Company, Palo Alto, Calif.

[21] Appl. No.: 811,111

[22] Filed: Mar. 3, 1997

[51] Int. Cl.[6] .................................................. H02H 3/00
[52] U.S. Cl. ........................ 361/119; 361/56; 361/58; 361/111; 361/113
[58] Field of Search ............................. 361/119, 56, 58, 361/111, 113, 118, 120, 127

[56] References Cited

U.S. PATENT DOCUMENTS

| | | | |
|---|---|---|---|
| 2,030,179 | 2/1936 | Potter | 178/44 |
| 2,777,998 | 1/1957 | Shepherd | 333/70 |
| 2,886,744 | 5/1959 | McNatt, Jr. | 317/61 |
| 2,922,913 | 1/1960 | Cushman | 313/225 |
| 3,274,447 | 9/1966 | Nelson | 317/61 |
| 3,777,219 | 12/1973 | Winters | 317/61.5 |
| 3,863,111 | 1/1975 | Martzloff | 317/61.5 |
| 3,968,411 | 7/1976 | Mueller | 317/61.5 |
| 4,050,092 | 9/1977 | Simokat | 361/56 |
| 4,142,220 | 2/1979 | Lundsgaard | 361/120 |
| 4,158,869 | 6/1979 | Gilberts | 361/118 |
| 4,359,764 | 11/1982 | Block | 361/119 |
| 4,409,637 | 10/1983 | Block | 361/119 |
| 4,517,497 | 5/1985 | Malone | 315/241 R |
| 4,554,608 | 11/1985 | Block | 361/119 |

OTHER PUBLICATIONS

*Aircraft Protection from Thunderstorm Discharges to Antennas*, J.M. Bryant, M.M. Newman, J.D. Robb, AIEE, pp. 880–884, Oct. 1953.

*Field Experience with Gas–Filled Protectors on Communicator Lines*, J.E.R. Lemieux IEEE, pp. 441–447, Jul. 1963.

*TII Condensed Catalog and Price List*, TII Industries, Inc. Mar. 15, 1978.

*Superfit Special Application Applicators*, RMS Electronics, Inc., 1980.

Primary Examiner—Jeffrey A. Saffin
Assistant Examiner—S. Jackson
Attorney, Agent, or Firm—Flehr Hohbach Test Albritton & Herbert LLP

[57] ABSTRACT

An electrical impulse suppressor comprising a band pass filter formed with strip transmission lines adapted to attenuate the flow of energy therethrough above and below a band limited range of frequencies. The suppressor used the impedance of a discharge means connected to a strip transmission live element to form the first of two resonant circuits used in the construction of the band pass filter.

3 Claims, 2 Drawing Sheets

ELECTROMAGNETIC IMPULSE SUPPRESSION CIRCUIT

BRIEF DESCRIPTION OF THE INVENTION

This invention relates generally to an electromagnetic impulse suppression circuit for radio frequency transmission lines and more particularly to an electromagnetic impulse suppression circuit employing a gas discharge tube and a distributed bandpass filter structure for matching the impedance of the gas discharge device to that of the transmission line.

BACKGROUND OF THE INVENTION

The use of gas discharge tubes shunted across a transmission line to protect receiving circuits from lightening and other electromagnetic impulses is well known.

U.S. Pat. Nos. 4,409,637 and 4,554,608 teach connectors which provide suppression of electromagnetic impulses traveling along a radio frequency transmission line. The connectors use a low pass filter network in combination with a DC blocking capacitor for providing the impulse suppression with impedance matching at frequencies up to and exceeding 1,000 MHz to minimize insertion losses. The continued movement of increasingly delicate and sensitive transistor amplifier towards the receiving antenna in order to improve the dynamic range of receivers in circuits that operate at high frequencies, the microwave range, have imposed severe new requirements for the circuitry used to protect the amplifiers from lightening and other electromagnetic impulses. When the prior art is implemented at frequencies above 1 GHz, the connector have unacceptable insertion loss and pulse leakage for the low noise amplifiers and transmitter circuits associated with the transmission lines. The losses are due primarily to parasitics inherent in the structure because of the difficulties in maintaining the dimensions for the elements of the filter network.

Prior art electromagnetic impulse suppressing devices using a quarter wavelength coaxial line to ground for shorting out DC and low frequency electromagnetic pulse energy while passing higher frequencies are known. However, in order to survive the impulse energy, the coaxial line to ground has to have correct dimensions to work at microwave frequencies. The quarter wavelength shunt lines have to be precisely machined and finished. Such craftsmanship is expensive and the resulting suppression devices are difficult and expensive to assemble requiring skilled hand labor.

As congestion in a given frequency allocation increases, the number of powerful transmitters at an antenna site increases, the rejection of unwanted signals also become paramount in maintaining the dynamic range of a receiver. Typically rejection is accomplished with bandpass filters. The bandpass filter is placed before the amplifier and series with the pulse suppressor.

It is desirable to have a circuit that will provide for the suppression of electromagnetic impulse energy and extraneous signals yet achieve bandpass characteristics at microwave frequencies with the absolute minimum amount of excessive losses while allowing for the introduction of DC controls on the signal line. Such a device also needs to be amenable to printed circuit integration in order to eliminate expensive hand labor and performance variability at microwave frequencies.

OBJECTS AND SUMMARY OF THE INVENTION

It is a general object of the present invention to provide an electromagnetic impulse suppression circuit which is suitable for operation at microwave frequencies.

It is another object of the present invention to provide a low loss electromagnetic impulse suppressor with minimal impulse leakage.

It is a further object of the present invention to provide an electromagnetic impulse suppressor employing strip transmission lines integrated in a printed circuit board to thereby eliminate expensive hand labor and performance variability at microwave frequencies.

It is yet another object of the invention to provide an electromagnetic impulse suppressor for shunting electromagnetic impulse energy traveling along a coaxial transmission line connected to a strip transmission line.

There is provided an electrical impulse suppressor for shunting electromagnetic energy traveling along a coaxial transmission line having a coaxial conductor and an outer conductor connected to a strip transmission line having primary and secondary conductors in which a discharge means is connected between the coaxial conductor and outer conductor with a shunt strip transmission line and the discharge means forming a first shunt resonant circuit. A second shunt strip transmission line resonant circuit is formed downstream from the first resonant circuit. A coupled strip transmission line is interposed between the first and second shunt resonant circuits. Said first and second shunt resonant circuits and said coupled strip transmission line form a filter for attenuating the flow of energy above and below a band limited range of microwave frequencies.

BRIEF DESCRIPTION OF THE DRAWINGS

The foregoing and other objects of the invention will be more clearly understood from the following description when read in conjunction with the accompanying drawings of which.

DESCRIPTION OF THE PREFERRED EMBODIMENT

Figure 1:
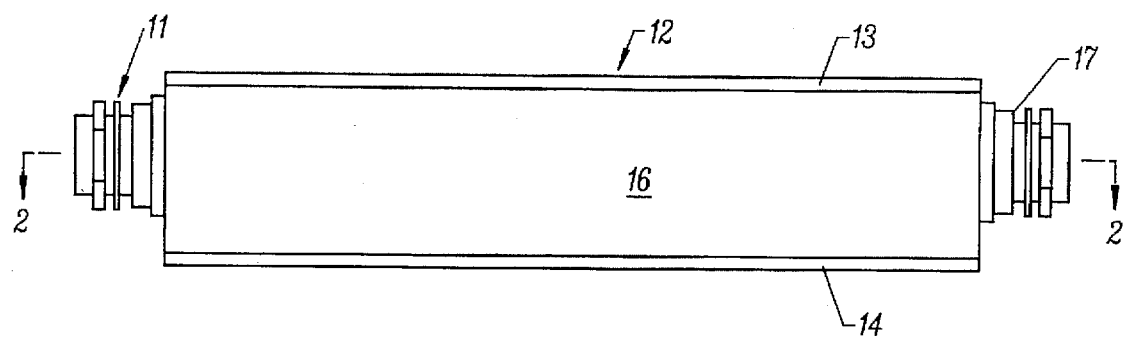
FIG. 1 is a side elevational view of a package microwave circuit employing an electrical impulse suppressor in accordance with the invention.
Figure 2:
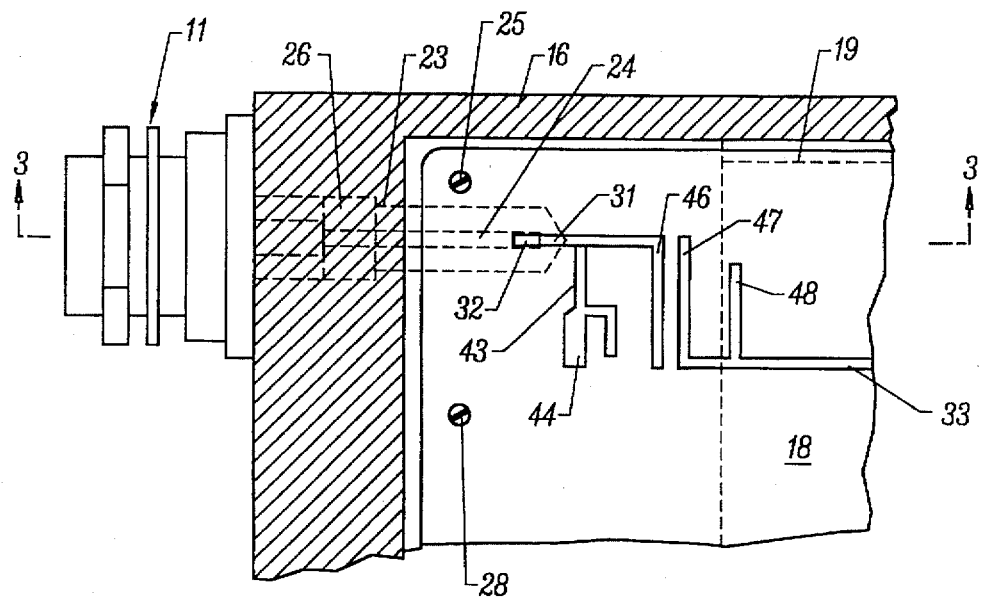
FIG. 2 is a sectional view taken generally along the line 2—2 of FIG. 1 showing an electrical impulse suppressor in accordance with the present invention interposed between a coaxial transmission line and a microstrip transmission line connected to a microwave circuit.

The coaxial transmission line which carries incoming microwave signals is connected to a coaxial connector 11 such as a DIN connector secured to housing 12, FIG. 1. The housing includes top and bottom plates 13, 14 secured to a frame 16. The microwave signals are processed, such as amplified, down converted, etc. by a microwave circuit housed in the housing. The processed signals are provided at output connector 17. The microwave processing circuits are carried by a printed wiring board 18, FIGS. 2 and 3. The printed wiring board is supported by a ledge 19 formed on the frame 16.

In accordance with the present invention, an electrical impulse suppressor is interposed between the coaxial connector 11 and the microwave processing circuits (not shown) carried by the wiring board 14. The outer conductor of the coaxial connector 11 is attached to and electrically connected to the frame 16 of the housing 12. The end wall 21 of the side wall ledges 19 support the printed circuit wiring board 18 with the ground plane 22 of the board in electrical contact with the end wall 21. The end wall 21 includes a well 23 which surrounds a center conductor 24 coaxially supported in the well by a dielectric sleeve 26. The center conductor 24 is suitably connected to the center conductor of the connector 11 as for example by a socket 27. The conductive ground plane 22 of the laminate or printed wiring board is secured to the block or end wall 21 as for example, by screws 28, which provide suitable pressure for good conductive connection. The printed wiring board includes a strip transmission line 31 which is connected to the center conductor 24 by a pin 32 and interacts with the ground plane to form a strip transmission line which is coupled to the associated microwave circuits (not shown) connected to the strip line section 33 by a bandpass filter which attenuates the flow of energy above and below a band limited range of frequencies.

Figure 3:
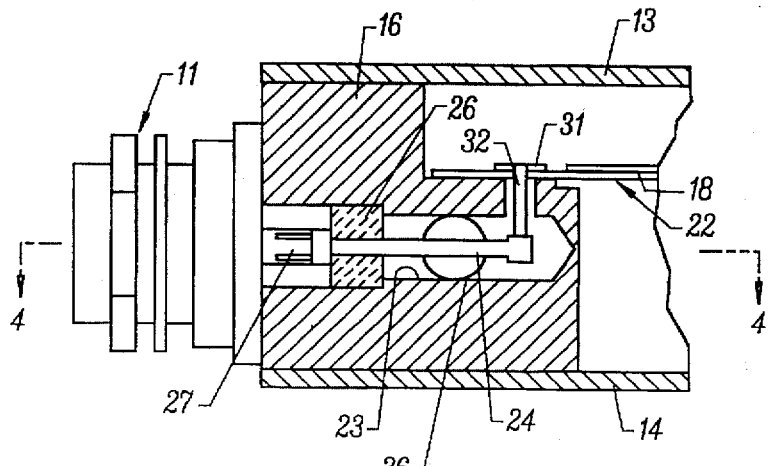
FIG. 3 is a sectional view taken along the line 3—3 of FIG. 2.
Figure 4:
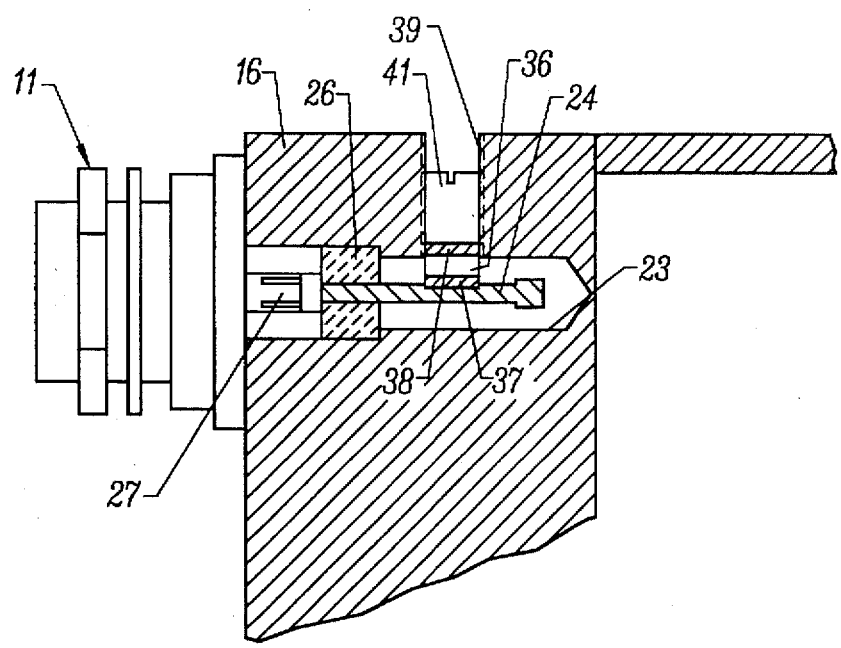
FIG. 4 is a sectional view taken along the line 4—4 of FIG. 3.

A discharge device 36 having known breakdown voltage, FIGS. 3 and 4, in the present example, comprises a gas discharge tube having conductive ends 37 and 38 connected between the center conductor 24 and the end wall 21. The gas discharge tube is disposed in a threaded opening 39 formed in the end wall 21. The gas discharge tube is placed in an opening and a screw 41 forces the conductive end 37 against a flat on the center conductor to form a competent electrical connection while the end 38 makes a competent electrical connection with the screw 41 which is received by the end wall 21 whereby the gas discharge tube is shunted at microwave frequencies between the center or primary transmission line and the outer or secondary transmission line. The discharge tube introduces parasitic capacitance in the transmission line with a resulting impedance mismatch leading to high VSWR (voltage standing wave ratio).

In accordance with the present invention, a bandpass filter network, comprising quarter wavelength microstrip transmission lines, is employed to transfer energy from the center conductor to the output strip transmission line 33. The bandpass filter is implemented by a first shunt strip quarter wavelength transmission line 43. The quarter wavelength transmission line and the stray capacitance of the discharge tube form a first resonant circuit. The shunt quarterwave transmission line 43 is terminated by a quarterwave open circuited strip line 44 which introduces a microwave bypass to ground. Thus, DC control signals can be introduced into the line via the DC bias port 45 and the quarterwave transmission line 43. Such an approach enables DC control signals to be introduced into the transmission line with an element that also matches the parasitic capacitance of the gas tube such that the DC bias method fundamentally provides low insertion losses.

Coupled strip transmission lines 46 and 47 transfer energy along the transmission line. This allows the voltage to build up in the gas discharge tube until ionization occurs. The coupled transmission lines 46 and 47 provide a series resonant circuit. Another quarter wave strip transmission line 48 is in shunt with the transmission line 33. The action of the shunt transmission line 48 is to provide another resonant circuit. The action of the two shunt resonant circuits and the series resonant circuit is to form a bandpass filter structure that transfers a narrow band of frequencies along the line while blocking the transmission of signals outside the narrow band of operation. The network also provides an impedance match at the microwave frequencies while suppressing extraneous VHF/UHF signals. The quarter wavelength sections are accomplished with strip transmission lines whose characteristic impedances are determined by modern filter synthesis techniques. It is understood from practical experience that the length of the strip transmission lines can vary considerably from the nominal quarterwave depending upon the various parasitics that are to be absorbed in the filter network. For example, the first transmission line shunted with the gas tube is shorter than the nominal quarter wavelength in order to absorb parasitic capacitance of the gas tube.

Figure 5:
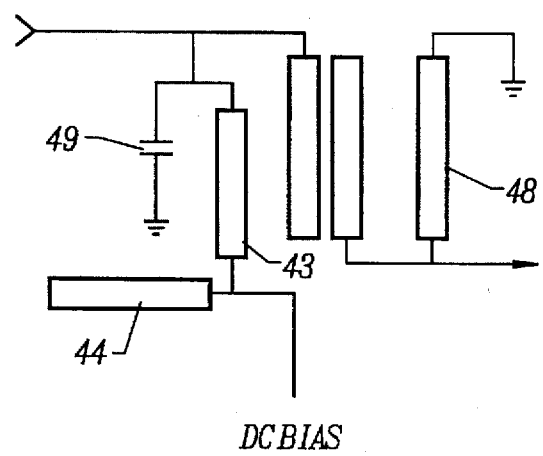
FIG. 5 is a schematic diagram of the electrical impulse suppressor of FIGS. 1–4.

FIG. 5 shows the equivalent circuit with like reference numerals referring to like parts. The first transmission line 43 and gas tube capacitance 49 form a first parallel resonant circuit. The coupled transmission lines 46 and 47 form a second resonant circuit. The shunt transmission line 48 forms a third resonant circuit. The three resonant circuits form a bandpass filter which matches the characteristic impedance of the system and which transmits energy over a narrow band of frequencies while blocking signals above and below the narrow band of frequencies.

The electromagnetic impulse suppressor of the present invention is interposed between an electrical coaxial connector and a printed wiring board mounted microwave circuit with printed microstrip transmission lines. The gas tube is mounted across the coaxial line in a manner commonly known in the industry. The coaxial line is transitioned into the printed wiring board where all of the distributed elements are fabricated directly on the board. The suppressor is amenable to printed circuit board wiring techniques which eliminate expensive hand labor and performance variability at microwave frequencies.

What is claimed is:

1. An electrical impulse suppressor for suppressing electromagnetic impulse energy in a coaxial transmission line connected to a microwave circuit including a strip transmission line comprising:

a discharge means having a known breakdown voltage and impedance connected between the center and outer conductors of the coaxial transmission line;

a first strip transmission line in shunt with said first portion of strip transmission line to form with the impedance of said discharge means a first resonant circuit;

a second strip transmission line in shunt with a second portion of said strip transmission line to form a second resonant circuit; and, coupled strip transmission lines interposed between said first and second portions of said transmission line, said coupled strip transmission line and said first and second resonant circuits to form a bandpass filter structure for attenuating the flow of energy above and below a band limited range of microwave frequencies.

2. An impulse suppressor as in claim 1 including a strip transmission line terminating the first shunt strip transmission line whereby DC bias voltage can be applied to the coaxial transmission line at the juncture of said terminating strip transmission line and said shunt transmission line.

3. An impulse suppressor for shunting electromagnetic impulse energy traveling along a transmission line having first and second conductors including:

a discharge device having known breakdown voltage and impedance connected between the first and second conductors;

a strip transmission line means connected in shunt with said discharge device forming therewith a first resonant circuit;

coupled strip transmission line interposed along one of said conductors;

a second strip transmission line means connected in shunt with said one conductor forming a second resonant circuit, said first and second resonant circuits and said coupled transmission line forming a bandpass filter which blocks the transfer of energy along said line at frequencies outside of said bandpass.

* * * * *